US012813018B2

(12) United States Patent
Pernel et al.

(10) Patent No.: US 12,813,018 B2
(45) Date of Patent: Nov. 24, 2026

(54) RELAXED GAN/INGAN STRUCTURE

(71) Applicant: COMMISSARIAT À L'ÉNERGIE ATOMIQUE ET AUX ÉNERGIES ALTERNATIVES, Paris (FR)

(72) Inventors: Carole Pernel, Grenoble (FR); Amélie Dussaigne, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 101 days.

(21) Appl. No.: 18/360,572

(22) Filed: Jul. 27, 2023

(65) Prior Publication Data

US 2023/0369541 A1 Nov. 16, 2023

Related U.S. Application Data

(62) Division of application No. 17/123,267, filed on Dec. 16, 2020, now Pat. No. 11,749,779.

(30) Foreign Application Priority Data

Dec. 19, 2019 (FR) ...................................... 1914962

(51) Int. Cl.
*H10H 20/824* (2025.01)
*H10H 20/01* (2025.01)
*H10H 20/815* (2025.01)

(52) U.S. Cl.
CPC .... *H10H 20/8242* (2025.01); *H10H 20/0137* (2025.01); *H10H 20/815* (2025.01)

(58) Field of Classification Search
CPC ............. H01L 21/02203; H01L 21/306; H01L 21/30635; H01L 27/153; H01L 27/156;
(Continued)

(56) References Cited

U.S. PATENT DOCUMENTS

2009/0001416 A1 1/2009 Chua et al.
2009/0140274 A1 6/2009 Wierer, Jr. et al.
(Continued)

FOREIGN PATENT DOCUMENTS

KR 101 245 509 B1 3/2013
WO 2010/112980 A1 10/2010
(Continued)

OTHER PUBLICATIONS

Even, A. et al: "Enhanced In incorporation in full InGaN heterostructure grown on relaxed InGaN pseudo-substrate" IN: Applied Physics Letters 110, Jun. 26, 2017, pp. 262103-262103-5.
(Continued)

*Primary Examiner* — Dmitriy Yemelyanov
(74) *Attorney, Agent, or Firm* — Chrisman Gallo Tochtrop LLC

(57) ABSTRACT

A process comprising the following steps of: a) providing a device comprising: a GaN/InGaN structure comprising an electrically conductive doped GaN layer locally covered with InGaN mesas comprising a doped InGaN layer and an undoped or weakly doped InGaN layer, an electrically insulating layer covering the electrically conductive doped GaN layer between the mesas, b) connecting the electrically conductive doped GaN layer and a counter-electrode (500) to a voltage or current generator, c) dipping the device and the counter-electrode into an electrolyte solution, d) applying a voltage or current between the electrically conductive doped GaN layer and the second electrode to porosify the doped InGaN layer, e) forming an InGaN layer by epitaxy on the InGaN mesas, whereby a relaxed epitaxially grown InGaN layer is obtained.

21 Claims, 5 Drawing Sheets

(58) Field of Classification Search
CPC ... H01L 33/007; H01L 33/0075; H01L 33/12; H01L 33/22; H01L 33/305; H01L 33/32; H01L 33/44
See application file for complete search history.

(56) References Cited

U.S. PATENT DOCUMENTS

| | | | | |
|---|---|---|---|---|
| 2013/0011656 | A1* | 1/2013 | Zhang | H01L 21/0262 205/684 |
| 2017/0237234 | A1 | 8/2017 | Han et al. | |
| 2020/0152841 | A1* | 5/2020 | Han | H01L 25/0753 |
| 2021/0057601 | A1* | 2/2021 | Oliver | H10H 20/01335 |
| 2024/0063340 | A1* | 2/2024 | Keller | H10H 29/142 |

FOREIGN PATENT DOCUMENTS

| | | | |
|---|---|---|---|
| WO | 2019027820 | A1 | 2/2019 |
| WO | 2021050731 | A1 | 3/2021 |

OTHER PUBLICATIONS

Jang, Lee-Woo et al. "Electrical and structural properties of GaN films and GaN/InGaN light-emitting diodes grown on porous GaN templates fabricated by combined electrochemical and photoelectrochemical etching" In: Elsevier Journal fo Alloys and Compounds, 2014, vol. 589, pp. 507-512.
Search Report for French application No. FR1914962 dated Aug. 5, 2020.

* cited by examiner

RELAXED GAN/INGAN STRUCTURE

CROSS-REFERENCE TO RELATED APPLICATIONS

This application is a divisional of U.S. patent application Ser. No. 17/123,267 filed on Dec. 16, 2020, which claims the priority of French Patent Application No. 1914962, filed on Dec. 19, 2019, each of which are incorporated by reference in their entirety.

TECHNICAL FIELD

The present invention is concerned with the general field of colour microdisplays.

The invention relates to a process for relaxing a GaN/InGaN structure.

The invention also relates to a relaxed GaN/InGaN structure.

The invention finds applications in many industrial fields, especially in the field of colour micro-displays based on micro-LEDs with a pitch of less than 10 μm.

STATE OF PRIOR ART

Colour microdisplays include red, green and blue pixels (RGB pixels).

The blue and green pixels can be made from nitride materials and the red pixels can be made from phosphor materials. To combine these three types of pixels on the same substrate, the so-called "pick and place" technique is generally used. However, in the case of microdisplays with pixels smaller than 10 μm, this technique can no longer be used due not only to alignment problems, but also to the time required to carry out such a technique on this scale.

Another solution is to perform colour conversion using quantum dot (QD) or nanophosphors. However, controlling the deposition of these materials on small pixels is difficult and their flow resistance is not sufficiently robust.

It is therefore crucial to be able to obtain the three RGB pixels natively with the same family of materials and on the same substrate. For this, InGaN is the most promising material. This material can, indeed, theoretically cover the entire visible spectrum depending on its indium concentration. Blue InGaN-based micro-LEDs already show a high luminance, much higher than their organic counterparts. To emit at green wavelengths, the quantum wells (QWs) of the LED should contain at least 25% indium and for red emission, at least 35% indium is required. Unfortunately, the quality of the InGaN material above 20% In is degraded due to the low miscibility of InN in GaN, but also due to the strong compressive stress inherent to the growth of the InGaN active zone on GaN.

It is therefore essential to be able to reduce the overall stress in GaN/InGaN-based structures.

To address this issue, several solutions have been contemplated.

A first solution is to form nanostructures, such as nanowires or pyramids, to be able to relax stresses through the free edges. The growth of axial nanowires can be achieved by molecular beam epitaxy (MBE). In practice, the low growth temperature used in MBE growth leads to low Internal Quantum Efficiencies (IQE). Pyramids are used to bend dislocations. In particular, complete pyramids have semi-polar planes favourable to the In incorporation and to the reduction of the internal electric field of the active zone. For truncated pyramids, the truncated faces allow quantum well growth on the c-plane, which leads to a more homogeneous emission compared to an emission along semi-polar planes of a complete pyramid. Alternatively, growth can also take place in a planar manner on planes other than the c-plane of the wurtzite structure, such as growth on the semi-polar planes which are more favourable to In incorporation.

Another solution is to reduce stresses in the active zone of the LED structure by using a substrate or pseudo-substrate with a lattice parameter closer to the lattice parameter of the InGaN alloy of the quantum wells. Thus, even with a planar configuration, the In incorporation rate in InGaN can be increased. It has been shown that, as the substrate lattice parameter increases, the internal electric field is reduced as compared to a stressed layer of the same In concentration and the quantum well emissions are shifted towards the red [1]. The resulting relaxed InGaN layer allows a III-N heterostructure to be grown by metal-organic vapour phase epitaxy (MOVPE). However, to date, to our knowledge, the only substrate that enabled this demonstration is Soitec's pseudo-substrate InGaNOS obtained by the Smart Cut™ technique.

Another solution to reduce overall stresses in GaN/InGaN-based LED structures is to porosify the GaN layer. In reference [2], a stack is first prepared comprising a sapphire substrate covered with an unintentionally doped GaN layer (uid GaN) and an n+ doped GaN layer. The doped GaN layer acts as the anode and a platinum wire acts as the cathode. Electrochemical porosification is carried out in an oxalic acid solution (0.2M) by applying a 15V voltage for 30 min and then under ultra-violet radiation in a KOH solution (0.06M) at 9V for 30 min. The porosified GaN layer thus obtained allows a multiple quantum well (MQWs) LED structure composed of an n+ GaN layer, five Gan/InGaN quantum wells (QWs) and a p GaN contact layer as well to be grown. Significant stress relaxation leads to better electrical and optical properties, especially with regard to photoluminescence (PL).

However, the crystal quality of the GaN layer of the LED depends on the pore diameter and porosity of the porosified GaN layer, as well as the desired thickness. It is therefore necessary to find suitable parameters each time, which complicates industrialisation of the process.

DISCLOSURE OF THE INVENTION

A purpose of the present invention is to provide a process which overcomes the drawbacks of prior art and makes it possible to obtain an at least partially or even totally relaxed GaN/InGaN structure, with a view to manufacturing, for example, red green blue pixels.

For this, the present invention provides a process for manufacturing an at least partially relaxed GaN/InGaN structure comprising the following steps of:

providing a device comprising:

a GaN/InGaN structure comprising an electrically conductive GaN layer locally covered with InGaN mesas, the InGaN mesas comprising a doped InGaN layer and an undoped or weakly doped InGaN layer, an electrically insulating layer covering the electrically conductive doped GaN layer between the mesas, (b) electrically connecting the electrically conductive doped GaN layer of the device and a counter-electrode to a voltage or current generator, (c) dipping the device and the counter-electrode in an electrolyte solution, d) applying a voltage or current between the electrically conductive doped GaN layer and the second electrode so as to porosify the doped InGaN layer of the mesas, e) forming a layer of InGaN by epitaxy on the InGaN mesas, whereby a relaxed epitaxially grown InGaN layer is obtained.

The invention differs fundamentally from prior art in that a step of selectively porosifying the doped InGaN layer of the mesas is carried out electrochemically. Porosification takes place in the volume of the doped InGaN layer.

The undoped or weakly doped InGaN layer is electrically insulating. It is not porosified in step d). It can therefore be used as an epitaxial regrowth layer on mesas.

It is easy to adjust pore dimensions according to the mesas doping, applied voltage and/or chosen electrolyte (nature and/or concentration) to achieve the desired relaxation rate, and hence the desired wavelength emitted by the active zone (quantum wells), obtained by re-epitaxy.

Porosification improves extraction efficiency, in particular when the pore size is comparable with the target wavelength.

This step can be carried out at a low thermal expenditure, especially at room temperature (typically around 20-25° C.), which avoids sublimation of the mesa material.

During epitaxial regrowth, the growth temperature used (typically from 900° C. to 1000° C.) allows the porosified layer to be modified, especially by enlarging the pores of this layer, which provides an additional degree of freedom while maintaining the lattice parameter adapted to the epitaxially regrown layer.

At the end of the process, an at least partially relaxed or even totally relaxed GaN/InGaN structure is obtained.

Advantageously, the undoped or weakly doped InGaN layer has a thickness of 0.25 to 3 nm.

Advantageously, the electrically insulating layer is of $SiO_2$ or SiN.

Advantageously, the indium rate present in the InGaN mesas is greater than or equal to 8%. This ensures In rich, quality re-epitaxy.

Advantageously, the mesas have a thickness of less than 100 nm. Thus, the defect density in the mesas is limited despite the high In concentration.

According to a first advantageous alternative, the device provided in step a) is manufactured by forming the electrically insulating layer and then the InGaN mesas.

According to another advantageous alternative, the device provided in step a) is manufactured by forming the InGaN mesas and then the electrically insulating layer.

Advantageously, the electrically conductive doped GaN layer covers a sapphire or silicon support.

Advantageously, the process includes a step during which an implantation doping or metal-organic vapour phase epitaxy doping step is performed on the InGaN mesas. Implantation is selective on the InGaN mesas.

Advantageously, the doped InGaN layer on the mesas has different doping types from one mesa to another. This results in pixels, for example three pixels, with different doping levels and therefore different relaxation percents, hence different emission wavelengths. This alternative embodiment is advantageous for forming a multispectral device, for example LEDs of different colours in a simplified manner, or a multi-colour micro-display.

According to one advantageous embodiment, the InGaN mesas of the structure provided in step a) are obtained according to the following steps of:

- applying a full-plate InGaN layer,
- locally performing an implantation doping or metal-organic vapour phase epitaxy doping step in the full-plate InGaN layer so as to have doped and undoped zones,
- depositing an unintentionally doped or weakly doped full-plate InGaN layer onto the full-plate InGaN layer,
- etching the full-plate InGaN layer through the undoped or weakly doped full-plate InGaN layer so as to remove the undoped zones, whereby InGaN mesas are locally formed comprising a doped InGaN layer and an undoped or weakly doped InGaN layer.

Advantageously, the doped zones have different doping types, whereby the doped InGaN layer of the mesas has different doping types from mesa to mesa.

This process has many advantages:

- It is simple to implement,
- it can be used for mesas with small thicknesses (typically less than 100 nm),
- mesa structuring provides the compliance effect,
- it leads to partial or total stress relaxation and reduces piezoelectric polarisation as compared to a stressed layer with the same In concentration,
- it allows a so-called “bottom up” approach for the manufacture of μLEDs and μdisplays: the growth of optical structures (N, QW, P) is achieved after mesa pixelisation, whatever the pixel size, and enables alignment problems as for the “pick and place” process to be dispensed with,
- there is no impact of the pixel etching process on the efficiency of the micro-LEDs, which makes it possible to make micrometric or sub-micrometric pixels.

The invention also relates to a GaN/InGaN structure successively comprising:

- an electrically conductive doped GaN layer,
- InGaN mesas comprising a porous doped InGaN layer and an undoped or weakly doped InGaN layer, preferably having a thickness ranging from 0.25 nm to 3 nm,
- an epitaxially grown and relaxed InGaN layer.

Advantageously, the undoped or weakly doped InGaN layer has a thickness ranging from 2 nm to 3 nm. This layer is non-porous.

By porous layer it is meant a layer with a porosity of more than 1%. Preferably it ranges from 5% to 70%. The top limit value is the maximum porosity before the start of the mesa delamination.

Further characteristics and advantages of the invention will appear from the following additional description.

Needless to say that this additional description is only given by way of illustration of the object of the invention and should in no way be construed as a limitation of that object.

BRIEF DESCRIPTION OF THE DRAWINGS

The present invention will be better understood upon reading the description of exemplary embodiments given purely by way of indicating and in no way limiting purposes, with reference to the appended drawings in which.

Figure 1A:
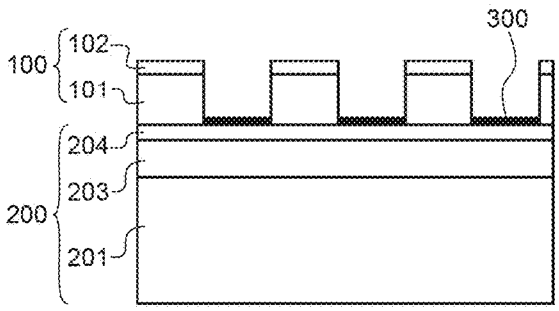
FIGS. 1A and 1B schematically represent, in a cross-section view, a device comprising a GaN/InGaN structure according to different particular embodiments of the invention.
Figure 1B:
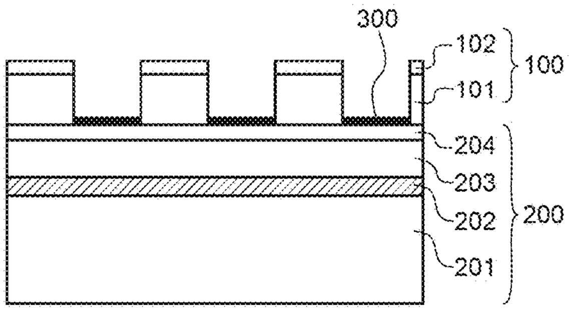
Figure 2A:
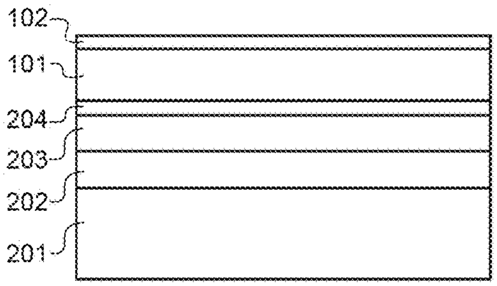
FIGS. 2A, 2B, 2C and 2D schematically represent different steps of the process for manufacturing the device comprising a GaN/InGaN structure, according to a particular embodiment of the invention.
Figure 2B:
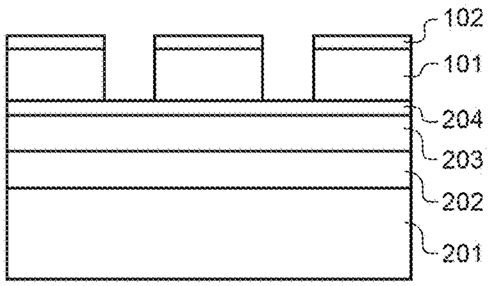
Figure 2C:
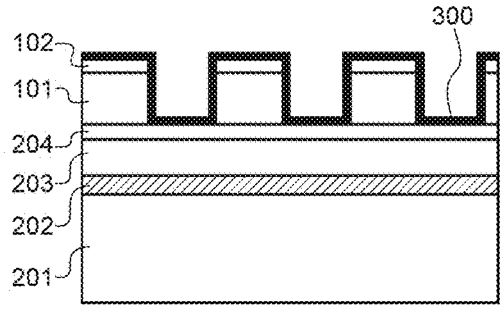
Figure 2D:
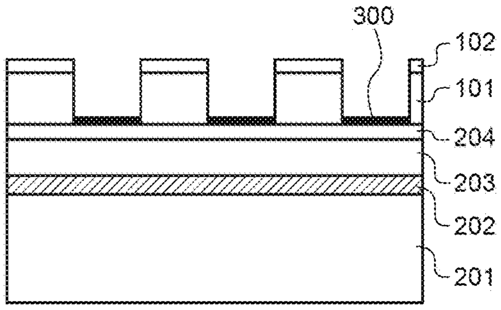

Different parts represented in the figures are not necessarily drawn to a uniform scale, to make the figures more legible.

Different possibilities (alternatives and embodiments) should be understood as being not mutually exclusive and be combinable with each other.

Furthermore, in the following description, terms that depend on the orientation, such as "on", "above", "below", etc., of a structure apply, considering that the structure is oriented in the way illustrated in the figures.

DETAILED DISCLOSURE OF PARTICULAR EMBODIMENTS

Although this is by no means limiting, the invention finds applications particularly in the field of colour micro-displays, and more particularly in the manufacture of red green blue pixels. However, it could also be used in the field of photovoltaics or even water splitting since, on the one hand, InGaN absorbs in the entire visible spectrum and, on the other hand, its valence and conduction bands are around the range of water stability, a thermodynamic condition necessary for the water decomposition reaction. The invention may also be of interest for the manufacture of LEDs or long wavelength emitting lasers.

The process, which makes it possible to obtain a partially or totally relaxed GaN/InGaN structure, consists in porosifying InGaN by electrochemical anodisation according to the following steps of:

providing a device comprising:

a GaN/InGaN structure comprising an electrically conductive doped GaN layer 204 locally covered with InGaN mesas 100, the InGaN mesas 100 comprising a doped InGaN layer 101 and an undoped or weakly doped InGaN layer 102, an electrically insulating layer 300 covering the electrically conductive GaN doped layer 204 between the mesas 100, b) electrically connecting the electrically conductive doped GaN layer 204 of the device and a counter-electrode 500 to a voltage or current generator, c) dipping the device and the counter-electrode 500 in an electrolyte solution, d) applying a voltage or current between the electrically conductive doped GaN layer 204 and the second electrode 500 so as to porosify the doped InGaN layer 101 of the mesas 100, e) performing epitaxy on the InGaN mesas 100, whereby an epitaxially grown, at least partially relaxed, and preferably fully relaxed InGaN layer is obtained.

The relaxation precent corresponds to:

$$\Delta a/a=(a_{c2}-a_{c1})/a_{c1}$$

with $a_{c1}$, the lattice parameter of the starting layer, and $a_{c2}$ the lattice parameter of the relaxed layer, The layer is 100% relaxed if act corresponds to the lattice parameter of the solid material.

When $a_{c1}=a_{c2}$ the layer is said to be stressed.

By partially relaxed it is meant a relaxation percent of more than 50%.

The device provided in step a) comprises a GaN/InGaN structure. More particularly, the device comprises a stack 200, the upper layer of which is an electrically conductive doped GaN layer 204, this layer being covered and in contact with InGaN mesas 100.

Advantageously, the layer stack 200 covered with InGaN mesas 100 comprises:

a support layer 201, or support, for example of sapphire or silicon, a first layer 202, preferably of unintentionally doped (uid GaN) gallium nitride (GaN) and/or a second layer 203, preferably of doped GaN (n GaN), a third layer corresponding to the electrically conductive doped GaN layer 204, this layer preferably being highly doped (n++GaN).

By unintentionally doped GaN, it is meant a concentration of less than $5^{e}17$ at/cm$^3$.

By doped GaN, it is meant a concentration of more than $10^{18}$ at/cm$^3$.

By highly doped GaN, it is meant a concentration greater than $10^{19}$ at/cm$^3$.

Preferably, stack 200 consists of the aforementioned layers. In other words, it does not include any other layers.

The support layer 201 has, for example, a thickness ranging from 350 μm to 2 mm. The thickness depends on the nature of the support layer 201 and its dimensions. For example, for a 2-inch diameter sapphire support, the thickness is 350 μm and for a 6-inch diameter sapphire support, the thickness is 1.3 mm.

The first layer 202 has, for example, a thickness ranging from 500 nm to 5 μm. This uid layer should absorb stresses related to the lattice mismatch between GaN and the substrate. Generally its thickness is between 1 and 4 μm.

The second layer 203 has, for example, a thickness ranging from 100 nm to 1 μm: it is present to ensure quality of the material of the upper layer 204.

The third layer 204 has, for example, a thickness ranging from 100 nm to 500 nm. It should be sufficiently conductive, the minimum thickness varying as a function of the doping rate.

The third, electrically conductive, layer 204 of stack 200 is directly in contact with the mesas 100 to be porosified. During the electrochemical anodising step, the electrically conductive layer 204 of stack 200 is used to perform recontacting on stack 200. This electrically conductive layer 204 is electrically connected to the voltage or current generator.

Mesas 100, also called elevations, are raised elements. They are obtained, for example, by etching a continuous layer or several superimposed continuous layers so that only a certain number of "reliefs" of this layer or these layers remain. Etching is generally plasma etching (or dry etching). The reliefs enable pixels to be defined.

Preferably, flanks of the mesas 100 are perpendicular to this layer stack 200.

The dimensions (width and length) of the mesas 100 range from 500 nm to 500 μm. By width and length, it is meant dimensions parallel to the surface of the underlying stack.

The pitch between two consecutive mesas 100 ranges from 50 nm to 20 μm.

InGaN mesas 100*s* consist of a doped InGaN layer 101 and an undoped or weakly doped InGaN layer 102.

Preferably, the mesas comprise these two layers 101, 102.

By doped InGaN, it is meant a doping concentration of more than $10^{18}$ at·$cm^3$, or even more than $10^{19}$ at·$cm^3$ for a so-called highly doped layer. The doping will be chosen according to the porosification technique (with or without illumination). The doped InGaN layer 101 is electrically conductive. It is porosified during step d).

By weakly doped InGaN, it is meant a doping concentration of less than $5 \cdot 10^{17}$ at·$cm^3$. The doping is low enough so that this layer is electrically insulating. Thus layer 102 is not anodised, and therefore not porosified during step d).

The doped layer 101 of the mesas 100 has advantageously a thickness ranging from 10 nm to 100 nm, preferably in the order of 30 nm. A layer with a small thickness (less than 100 nm) can contain a high In concentration while maintaining good material quality (few defects). By thickness, it is meant the dimension of the mesa perpendicular to the underlying stack.

The undoped or weakly doped InGaN layer 102 has, for example, a thickness ranging from 1 nm to 5 nm, and preferably a thickness ranging from 2 to 3 nm. This layer should provide a continuous interface to ensure coalesced epitaxial regrowth. It is advantageously chosen thin, for example, between 0.25 nm and 3 nm, so that it is defect-free and can be relaxed by virtue of the subsequent porosification process of the lower layer 101 and the epitaxial regrowth on the mesas.

The electrically conductive layer 204 is covered, between the mesas 100, with an electrically insulating layer 300 in order not to be in contact with the electrolyte solution during the porosification step and thus not to be porosified.

The electrically insulating layer 300 can be of oxide or nitride. Preferably, silicon oxide or silicon nitride will be chosen. It has, for example, a thickness ranging from 5 nm to 100 nm. For a stoichiometric nitride or oxide, a thickness of 30 nm or less will be chosen.

According to a first alternative embodiment, represented in FIGS. 2A to 2D, such a device can be manufactured according to the following steps of:

- providing a stack 200 comprising, for example, a support 201 of sapphire or silicon, successively covered with a first layer 202 of uid GaN and/or a second layer 203 of doped GaN, and a third, electrically conductive, layer 204 of highly n-doped GaN,
- forming a highly doped InGaN layer 101, then an undoped or weakly doped InGaN layer 102,
- structuring, for example by photolithography, the highly doped InGaN layer 101 and undoped InGaN layer 102 so as to make mesas 100,
- forming an electrically insulating layer 300, for example of $SiO_2$ or SiN, between the mesas 100 so as to passivate the electrically conductive layer 204.

The controlled etching of the mesas 100 allows stopping on or in the n++ GaN layer. By "on the n++ GaN layer", it is meant at the interface of the n++ GaN layer 204 and the doped InGaN layer 101. In other words, the n++ GaN layer is not completely etched in such a way as to ensure electrical conduction during electrochemical porosification.

Figure 3A:
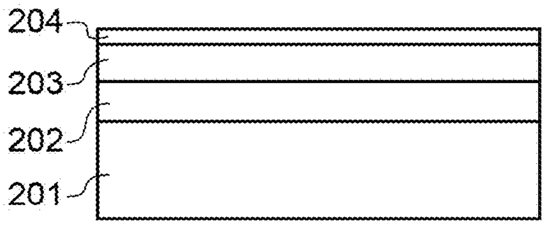
FIGS. 3A, 3B and 3C schematically represent different steps of the process for manufacturing the device comprising a GaN/InGaN structure, according to another particular embodiment of the invention.
Figure 3B:
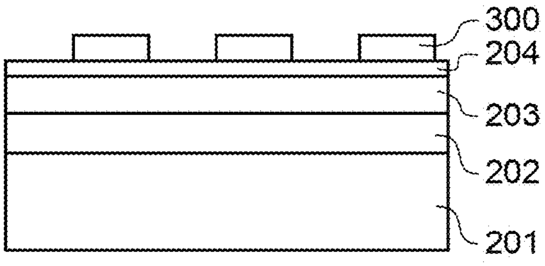
Figure 3C:
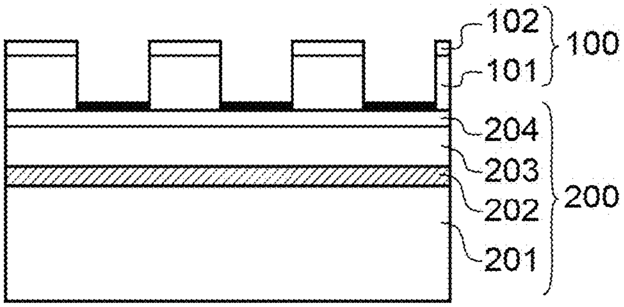

According to an alternative embodiment, represented in FIGS. 3A to 3C, such a device can be manufactured according to the following steps of:

- providing a stack 200 comprising, for example, a support 201 of sapphire or silicon, successively covered with a first layer 202 of uid GaN and/or a second layer 203 of doped GaN, and a third, electrically conductive, layer 204 of highly n-doped GaN,
- forming an electrically insulating layer 300, for example of $SiO_2$ or SiN, locally covering the electrically conductive layer 204,
- forming the mesas 100 in the zones of the electrically conductive layer 204 not covered with the electrically insulating layer 300, by forming a doped InGaN layer 101 and then an undoped or weakly doped InGaN layer 102.

According to this embodiment, the electrically insulating layer 300 can be obtained by depositing a continuous layer and then etching it. It is also possible to deposit the electrically insulating layer 300 through a mask. Localized growth of the mesas 100 is then carried out.

According to these alternative embodiments, it is possible to perform doping of the doped layer 101 of the mesas 100, for example, by implanting silicon (Si(n)) or implanting magnesium (Mg(p)).

The layers 101 of the mesas 100 can have the same or different doping types. The use of different doping types makes it possible to vary the porosification rate of the mesas according to their initial doping level for a given applied potential. The mesas will be thereby more or less relaxed and more or less able to integrate indium into the layers. It is thus easy to obtain pixels of different colours after epitaxial regrowth.

According to an advantageous embodiment, the InGaN mesas of the structure provided in step a) can be obtained according to the following steps of:

- depositing a so-called full-plate InGaN layer (i.e. a continuous layer) on the electrically conductive highly n-doped GaN layer 204,
- locally performing an implantation step in the full-plate InGaN layer so as to have doped zones and less doped or even undoped zones; for example, for 3 n-type doping levels, 2 lithographies and hard masks may be carried out and silicon be implanted,
- advantageously, performing a so-called healing thermal annealing,
- depositing an unintentionally doped or weakly doped (typically with a residual between $5 \cdot 10^{16}$ and $1 \cdot 10^{17}/cm^3$) full-plate InGaN layer onto the full-plate InGaN layer, for example by epitaxy,
- etching the full-plate InGaN layer through the undoped or weakly doped full-plate InGaN layer so as to remove non-implanted zones, whereby InGaN 100 mesas are formed comprising a doped InGaN layer 101 and an undoped or weakly doped InGaN layer 102.

By way of illustration, it is, for example, possible to use a hard mask, such as a SiN or $SiO_2$ type mask, to carry out implantation and alignment marks (for example Al, Ti, TiN) to match the mesas to the implanted zones. With two different masks, two zones with different implantation energies can be made, and thus two different doping types in addition to the initial doping of the doped plate, for example by MOCVD. Alignment marks enable both masks to be aligned for implantation and the mask for mesa etching.

The same set of masks will be used for implantation and mesas.

Advantageously, for an undoped or weakly doped InGaN layer having low thickness, it is possible to perform implantation of the underlying InGaN layer through this layer.

For p-type doping, magnesium can be implanted.

Advantageously, the doped zones have different doping types, so that the doped InGaN layer of the mesas has different doping types. The higher the doping rate, the greater the porosification at a fixed potential. The relaxation of the dense InGaN layer depends on the porosification rate of the mesas. As a result, different amounts of indium may be incorporated when re-epitaxially growing InGaN on the dense layer (by virtue of reducing the "compositional pulling effect" (i.e. pushing In atoms towards the surface, preventing them from being incorporated into the layer). Thus, after epitaxy of the complete LED structure, red, green and blue (RGB) mesas will be obtained on a same substrate, as well as in a single growth step, if the deviation between the relaxation levels of the mesas is sufficient.

Alternatively, in these different embodiments, implantation doping can be replaced by Metal-organic Chemical Vapour Deposition (MOCVD) doping, especially with Si or Ge as dopant. It is, for example, possible to carry out three successive epitaxy steps with successive masking operations to obtain three different doping levels in order to form RGB mesas at the end of the process.

In what follows, an n-type doping will be described, but it could be a p-type doping.

Figure 4:
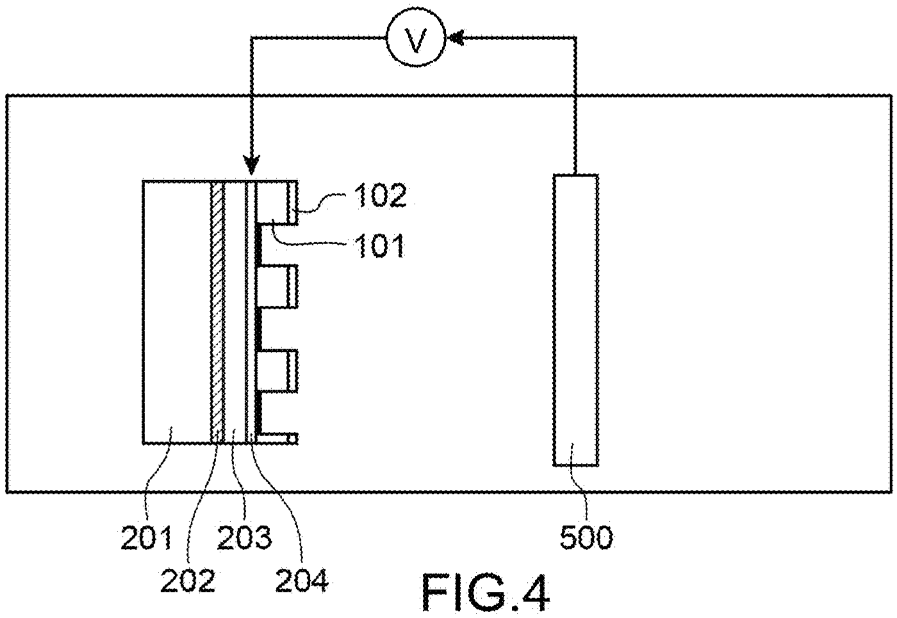
FIG. 4 schematically represents a step of electrochemically anodising InGaN mesas in a particular embodiment of the invention.

In step b), the device and a counter-electrode (CE) 500 are electrically connected to a voltage or current generator (FIG. 4). The device acts as a working electrode (WE). Later it will be referred to as a voltage generator, but it could be a current generator for applying a current between the device and the counter-electrode.

The counter-electrode 500 is of an electrically conductive material, such as for example a metal like platinum.

In step c), the electrodes are dipped into an electrolyte, also called an electrolyte bath or electrolyte solution. The electrolyte can be acidic or basic. The electrolyte is, for example, oxalic acid. It can also be KOH, HF, $HNO_3$, $NaNO_3$ or $H_2SO_4$.

It is possible to perform step c) before step b).

In step d), a voltage is applied between the device and the counter-electrode 500. The voltage can range from 1 to 100V. It is applied, for example, for a period ranging from a few seconds to several hours. Porosification is complete when there is no more current at an imposed potential. At this point, the entire doped structure is porosified and the electrochemical reaction stops.

Figure 5:
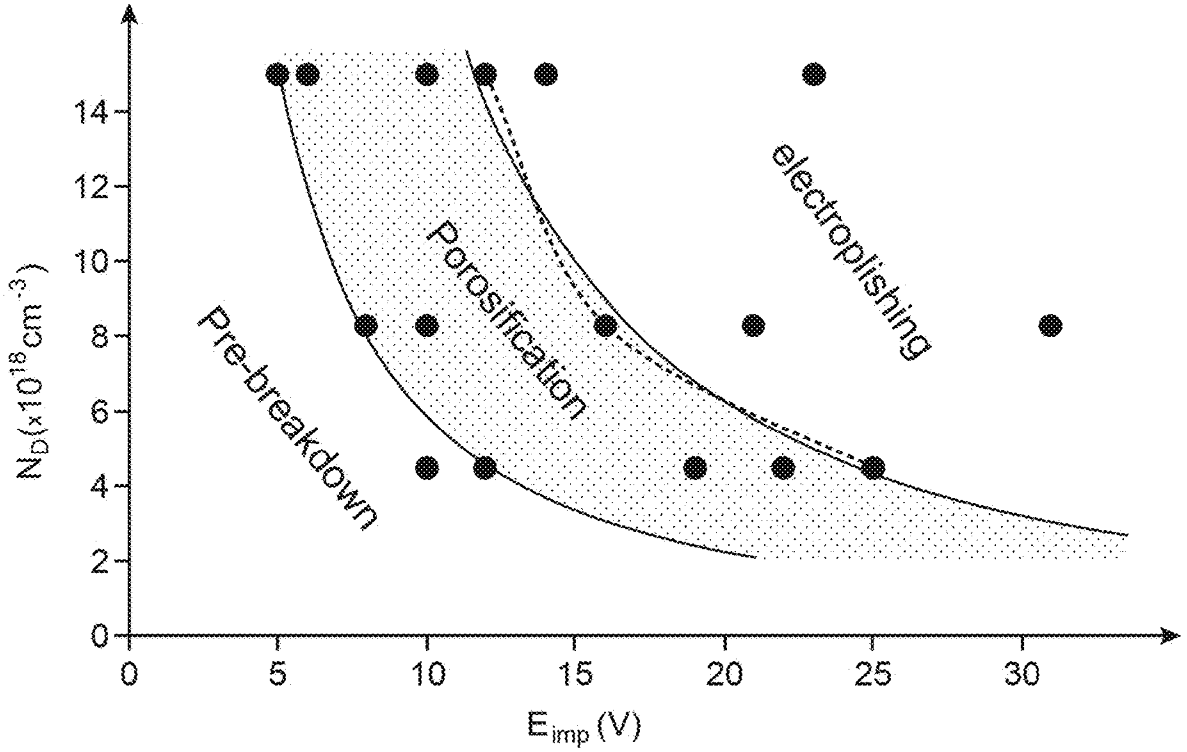
FIG. 5 is a graph representing different phenomena (prebreakdown, porosification and electropolishing) occurring during an anodisation step, as a function of the doping rate and the potential applied, according to a particular embodiment of the invention.

The difference in the doping rate makes it possible to have a high selectivity between porosification and electropolishing (FIG. 5). This "chart" makes it possible to define for given conditions, respective doping rates so that, at a given potential, there is selectivity between the highly doped zone and weakly doped zone.

The electrochemical anodising step can be carried out under ultraviolet (UV) light. The process can also include a first electrochemical anodisation without adding ultra-violet radiation and a second electrochemical anodisation by adding ultra-violet radiation. This embodiment is particularly interesting since, for example, firstly the upper n+ doped layer can be porosified, with the porosification stopping abruptly on the uid GaN. Then, secondly, UV light can generate charges in the uid GaN and undoped GaN can thus be porosified.

Advantageously, the porosification takes place in the entire volume of the doped InGaN layer 101 of the mesas 100.

At the end of the porosification step, the porosity of the doped InGaN layer 101 is at least 10%. It preferably ranges from 25% to 50%.

The largest dimension (the height) of the pores can vary from a few nanometres to a few micrometres. The smallest dimension (the diameter) can vary from a few nanometres to a hundred nanometres, in particular from 30 to 70 nm.

The porosification obtained (porosity rate and pore size) depends on the doping of the doped InGaN layer 101 of the mesas 100 and the process parameters (applied voltage, period of time, nature and concentration of the electrolyte, chemical post-treatment or annealing). By varying the porosification, the rate of incorporation/segregation can be controlled. The porosification, and in particular the pore size, may vary subsequently, during epitaxial regrowth, depending on the temperature applied.

The porosification step provides a totally or partially relaxed doped InGaN layer 101.

Following the porosification step, an epitaxial regrowth is performed on the InGaN mesas 100 (step e), for example to form epitaxially regrown LEDs.

Epitaxial regrowth is performed on the undoped InGaN layer 102 of the mesas 100. As layer 102 is not porosified during the electrochemical anodisation step, it enables an epitaxial regrowth to be performed on a continuous, dense, non-porous 2D layer. The epitaxial regrowth is thus facilitated and the epitaxially grown layer has a better resistance. The creation of defects related to pore coalescence is avoided.

Different growth processes can be used to form an epitaxially grown layer 400.

Figure 6A:
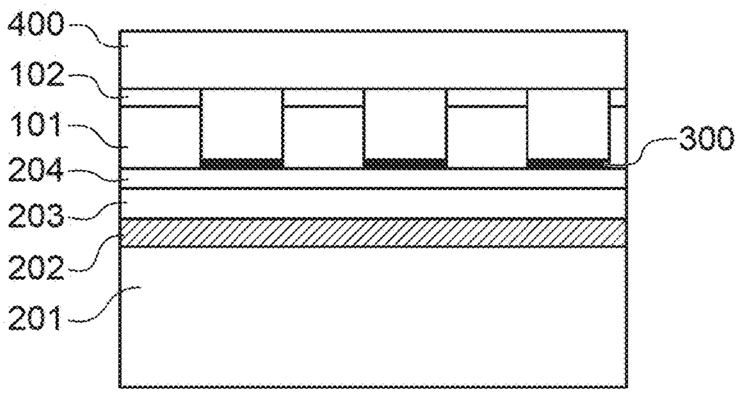
FIGS. 6A and 6B schematically represent an epitaxial regrowth on InGaN mesas, according to different particular embodiments of the invention.

According to a first alternative embodiment, represented in FIG. 6A, the regrowth is lateral and a subsequent pixelisation step by etching is advantageously performed. It is also possible to passivate the flanks with a layer having a small thickness (for example 3 nm), preferably by atomic layer deposition (ALD).

Figure 6B:
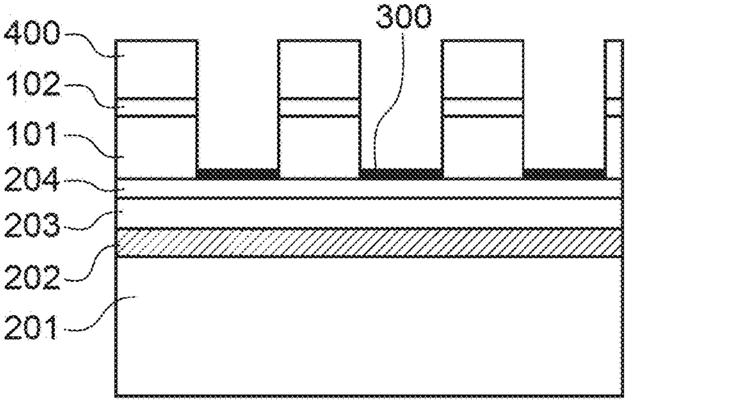

According to an alternative embodiment, represented in FIG. 6B, the regrowth takes place vertically above the mesas. In this alternative, pixels correspond to the underlying mesas.

The epitaxially grown layer 400 is advantageously of gallium nitride or indium gallium nitride.

Advantageously, a passivation layer will be deposited onto the flanks of the mesas 100 and the epitaxially regrown LEDs, for example by atomic layer deposition (ALD). The passivation layer can be of alumina. The passivation layer can have a thickness of a few nanometres, for example 2 to 5 nm.

The epitaxially regrown stack of an all-InGaN LED can comprise, for example, successively from the unintentionally doped InGaN layer 102:

- an n-doped InGaN layer 401, preferably having the same In concentration as the InGaN layer of the substrate,
- an active zone 402 with one or more red or green emitting InGaN/(Ga,In) N quantum wells,
- a p-doped AlGaN or GaN based electron barrier 403
- a p-doped InGaN layer 404, preferably having an In concentration less than or equal to that of the n-InGaN layer,
- a p++ doped InGaN layer 405, preferably having the same In concentration as the p-InGaN layer.

More particularly, an all-InGaN LED structure can successively comprise:

- an InGaN substrate,
- a 350 nm n-doped InGaN layer, formed by $15\times In_{0.03}Ga_{0.97}N/GaN$ (thicknesses nm/1.8 nm),
- multiple quantum wells (MQWs), formed by $5\times In_{0.40}Ga_{0.60}N/In_{0.03}Ga_{0.097}N$ (thicknesses 2.3 nm/5, 7, 11 nm),
- a uid $In_{0.03}Ga_{0.97}N$ layer (10 nm),
- an $Al_{0.1}Ga_{0.9}N$:Mg layer (20 nm),
- an Mg-doped $In_{0.03}Ga_{0.97}N$ layer (125 nm),
- a p++ doped $In_{0.03}Ga_{0.97}N$ layer (25 nm).

Illustrative and Non-Limiting Examples of One Embodiment

In this example, a stack 200 is used, comprising: a sapphire support 201, a (uid) GaN layer 202, a doped GaN (n GaN) layer 203 and a highly doped GaN (n++GaN) layer 204.

To make the InGaN mesas 100, a $In_{0.0008}Ga_{0.992}N$ (n-doped: $10^{19}$ at/$cm^3$) layer 101 less than 100 nm thick is deposited on this stack 200. A InGaN layer 102 of the same composition, but undoped, of small thickness (from 2 to 3 nm) is deposited in order to facilitate subsequent epitaxial regrowth.

The mesas 100 are then structured using conventional photolithography techniques. The dimensions of the mesas 100 obtained are from 500 nm to 10 μm. The controlled etching of the InGaN layer allows stopping on or in the n++ GaN layer.

The n++ 204 GaN layer is then passivated with a layer 300 of $SiO_2$ or SiN for example.

Figures 7A, 7B, 7C, 7D:
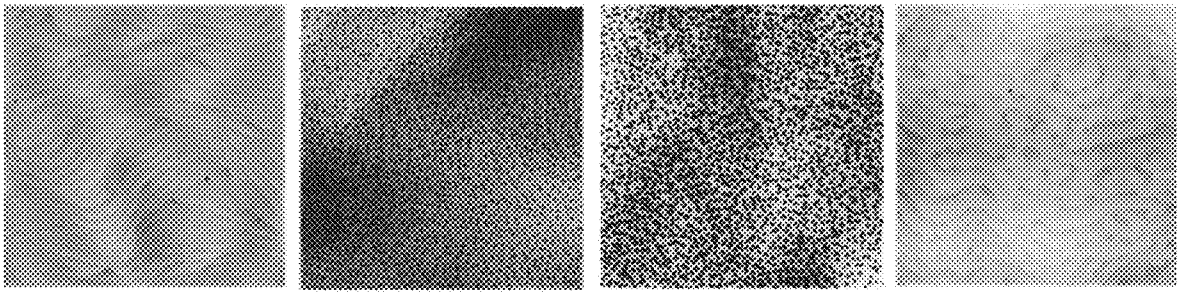
FIGS. 7A, 7B, 7C and 7D are atomic force microscope (AFM) pictures of a 0.8% InGaN layer before porosification, after porosification, after porosification and annealing, and finally after epitaxial regrowth, respectively.
Figure 8:
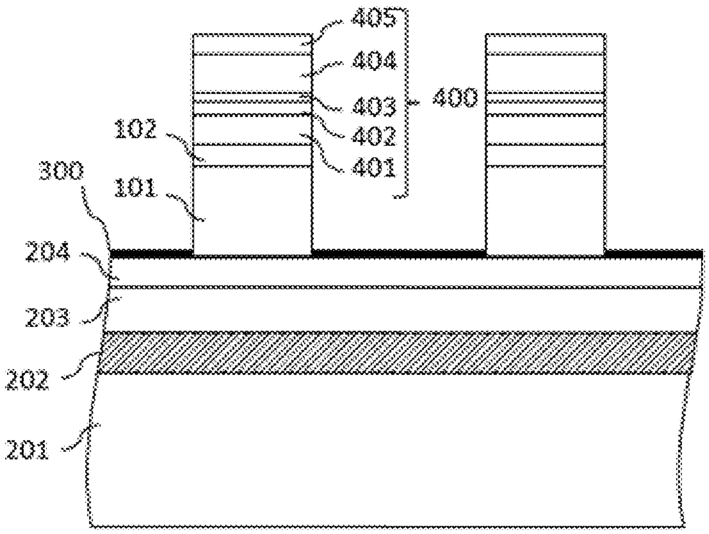
FIG. 8 schematically represents an epitaxial regrown stack of an InGaN mesa of an all-InGaN LED, according to an embodiment of the invention.

The AFM image of the InGaN layer before porosification is represented in FIG. 7A.

The porosification is then carried out by electrochemically anodising the InGaN mesas in an electrolyte solution containing from 0.1 mol/L to 0.5 mol/L oxalic acid, for example 0.2 mol/L. The voltage applied is 24V. The mesas then contain an In concentration close to that of the wells and are completely or almost completely relaxed. The AFM image of the InGaN layer after porosification is represented in FIG. 7B.

Annealing is then carried out, for example at 900° C. (FIG. 7C).

Finally, an epitaxial regrowth is performed on the InGaN mesas 100 (FIG. 7D).

Photoluminescence (PL) characterizations have been carried out. Before porosification, the emission of the 0.8% InGaN sample is at 356 nm. After the epitaxial regrowth, the emission is at 364 nm. Samples made with 2% InGaN show the same trend. This deviation in PL may be the signature of stress relaxation and/or increased In integration.

REFERENCES

[1] Even et al, "Enhanced In incorporation in full InGaN heterostructure grown on relaxed InGaN pseudo-substrate", Appl. Phys. Lett. 110, 262103 (2017).

[2] Jang et al, "Electrical and structural properties of GaN films and GaN/InGaN light-emitting diodes grown on porous GaN templates fabricated by combined electrochemical and photoelectrochemical etching", Journal of Alloys and Compounds 589 (2014) 507-512.

What is claimed is:

1. A GaN/InGaN structure successively comprising:

a) a non-porous electrically conductive doped GaN layer;

b) InGaN mesas in contact with the non-porous electrically conductive doped GaN layer, wherein the InGaN mesas comprise:

a porous doped InGaN layer, and an undoped or weakly doped non-porous InGaN layer in direct contact with the porous doped InGaN layer; and c) a relaxed epitaxially grown InGaN layer in direct contact with the undoped or weakly doped non-porous InGaN layer.

2. The GaN/InGaN structure according to claim 1, wherein the undoped or weakly doped non-porous InGaN layer has a thickness ranging from 0.25 nm to 3 nm.

3. The GaN/InGaN structure according to claim 2, wherein the undoped or weakly doped non-porous InGaN layer has a thickness ranging from 2 nm to 3 nm.

4. The GaN/InGaN structure according to claim 1, wherein the porous doped InGaN layer of the InGaN mesas has a thickness ranging from 10 nm to 100 nm.

5. The GaN/InGaN structure according to claim 1, wherein the InGaN mesas have a thickness of less than 100 nm.

6. The GaN/InGaN structure according to claim 5, wherein dimensions (width and length) of the InGaN mesas range from 500 nm to 500 μm.

7. The GaN/InGaN structure according to claim 1, wherein a pitch between two consecutive mesas ranges from 50 nm to 20 μm.

8. The GaN/InGaN structure according to claim 1, wherein the porous doped InGaN layer of the InGaN mesas is doped with silicon (Si(n)) or magnesium (Mg(p)).

9. The GaN/InGaN structure according to claim 1, wherein the porous doped InGaN layer of the InGaN mesas has the same doping types from one mesa to another.

10. The GaN/InGaN structure according to claim 1, wherein the porous doped InGaN layer of the InGaN mesas has different doping types from one mesa to another.

11. The GaN/InGaN structure according to claim 1, wherein the porous doped InGaN layer has a porosity of between 5% and 70%.

12. The GaN/InGaN structure according to claim 11, wherein the porosity is between 25% and 50%.

13. The GaN/InGaN structure according to claim 1, wherein the height of the pores is from 3 nm to 3 mm and the diameter of the pores is from 3 nm to 100 nm.

14. The GaN/InGaN structure according to claim 1, wherein the GaN/InGaN structure is at least partially relaxed (a relaxation percent of more than 50%), wherein the relaxation percent corresponds to:

$$\Delta a/a=(a_{c2}-a_{c1})/a_{c1}$$

with $a_{c1}$ being the lattice parameter of the undoped or weakly doped InGaN layer, and $a_{c2}$ being the lattice parameter of the relaxed epitaxially grown InGaN layer.

15. The GaN/InGaN structure according to claim 14, wherein the GaN/InGaN structure is totally relaxed.

16. A device comprising the GaN/InGaN structure according to claim 1, and wherein the relaxed epitaxially grown InGaN layer is an epitaxially regrown stack of an all-InGaN LED comprising an n-doped InGaN layer, a p-doped InGaN layer, and an active zone, between the n-doped and p-doped InGaN layers.

17. The device according to claim 16, wherein one or more LEDs are included to form a multicolor microdisplay.

18. The device according to claim 16, wherein the porous doped InGaN layers of the InGaN mesas have different doping types and are present on a single substrate.

19. The device according to claim 16, wherein the device consists of only InGaN LEDs.

20. The GaN/InGaN structure according to claim 1, wherein the indium concentration in the InGaN mesas is greater than or equal to 8%.

21. The GaN/InGaN structure according to claim 1, wherein the InGaN mesas are separated by electrically insulating layers.

* * * * *